United States Patent
Tsai et al.

(10) Patent No.: US 9,472,666 B2
(45) Date of Patent: Oct. 18, 2016

(54) ULTRA HIGH VOLTAGE DEVICE

(71) Applicant: Taiwan Semiconductor Manufacturing Company Limited, Hsinchu (TW)

(72) Inventors: Ming-Fu Tsai, Hsinchu (TW); Yu-Ti Su, Tainan (TW); Jen-Chou Tseng, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/620,295

(22) Filed: Feb. 12, 2015

(65) Prior Publication Data

US 2016/0240668 A1    Aug. 18, 2016

(51) Int. Cl.
*H01L 29/66* (2006.01)
*H01L 29/78* (2006.01)
*H01L 29/06* (2006.01)
*H01L 29/08* (2006.01)

(52) U.S. Cl.
CPC ....... *H01L 29/7835* (2013.01); *H01L 29/0615* (2013.01); *H01L 29/0653* (2013.01); *H01L 29/0688* (2013.01); *H01L 29/0847* (2013.01); *H01L 29/7823* (2013.01); *H01L 29/7836* (2013.01)

(58) Field of Classification Search
CPC ........... H01L 29/7835; H01L 29/7823; H01L 29/7836; H01L 29/0688; H01L 29/0615; H01L 29/0847; H01L 29/0653
See application file for complete search history.

(56) References Cited

U.S. PATENT DOCUMENTS

| | | | | |
|---|---|---|---|---|
| 5,275,961 | A * | 1/1994 | Smayling | H01L 27/11526 148/DIG. 82 |
| 5,585,294 | A * | 12/1996 | Smayling | H01L 27/088 257/E21.417 |
| 5,633,521 | A * | 5/1997 | Koishikawa | H01L 29/0692 257/336 |
| 5,719,421 | A * | 2/1998 | Hutter | H01L 29/0692 257/335 |
| 5,827,784 | A * | 10/1998 | Loos | H01L 21/31111 134/1.3 |
| 7,091,556 | B2 * | 8/2006 | Edwards | H01L 27/088 257/336 |
| 7,102,194 | B2 * | 9/2006 | Huang | H01L 29/0634 257/335 |
| 8,159,001 | B2 * | 4/2012 | Wang | H01L 21/743 257/134 |
| 2003/0038316 | A1 * | 2/2003 | Tsuchiko | H01L 29/7801 257/324 |
| 2011/0186928 | A1 * | 8/2011 | Ichikawa | H01L 29/78 257/344 |
| 2011/0241069 | A1 * | 10/2011 | Vashchenko | H01L 27/0262 257/140 |
| 2012/0299096 | A1 * | 11/2012 | Huo | H01L 29/0696 257/343 |
| 2014/0061721 | A1 * | 3/2014 | Chan | H01L 29/861 257/141 |
| 2014/0175547 | A1 * | 6/2014 | Chan | H01L 29/7816 257/343 |
| 2014/0264581 | A1 * | 9/2014 | Chan | H01L 29/42368 257/339 |
| 2015/0236149 | A1 * | 8/2015 | Huang | H01L 29/7835 257/339 |

\* cited by examiner

*Primary Examiner* — Jarrett Stark
(74) *Attorney, Agent, or Firm* — Jones Day

(57) ABSTRACT

According to an embodiment, a semiconductor device is provided. The device includes: The second region has a greater curvature than the first region. The device includes: an N-type epitaxy layer; a P-well in the N-type epitaxy layer; a drain in the N-type epitaxy layer; a source in the P-well; and a bulk in the P-well and in contact with the source, wherein the bulk has a greater area in the second region than in the first region.

19 Claims, 8 Drawing Sheets

ULTRA HIGH VOLTAGE DEVICE

BACKGROUND

Many electronic components, especially microchips, can be damaged by ESD (Electro Static Discharge). Sensitive components need to be protected from ESD. UHV (Ultra High Voltage) devices often suffer from low ESD capability due to non-uniform E-field distribution and local current crowding effect at a discontinuous region or a high curvature region of the devices. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
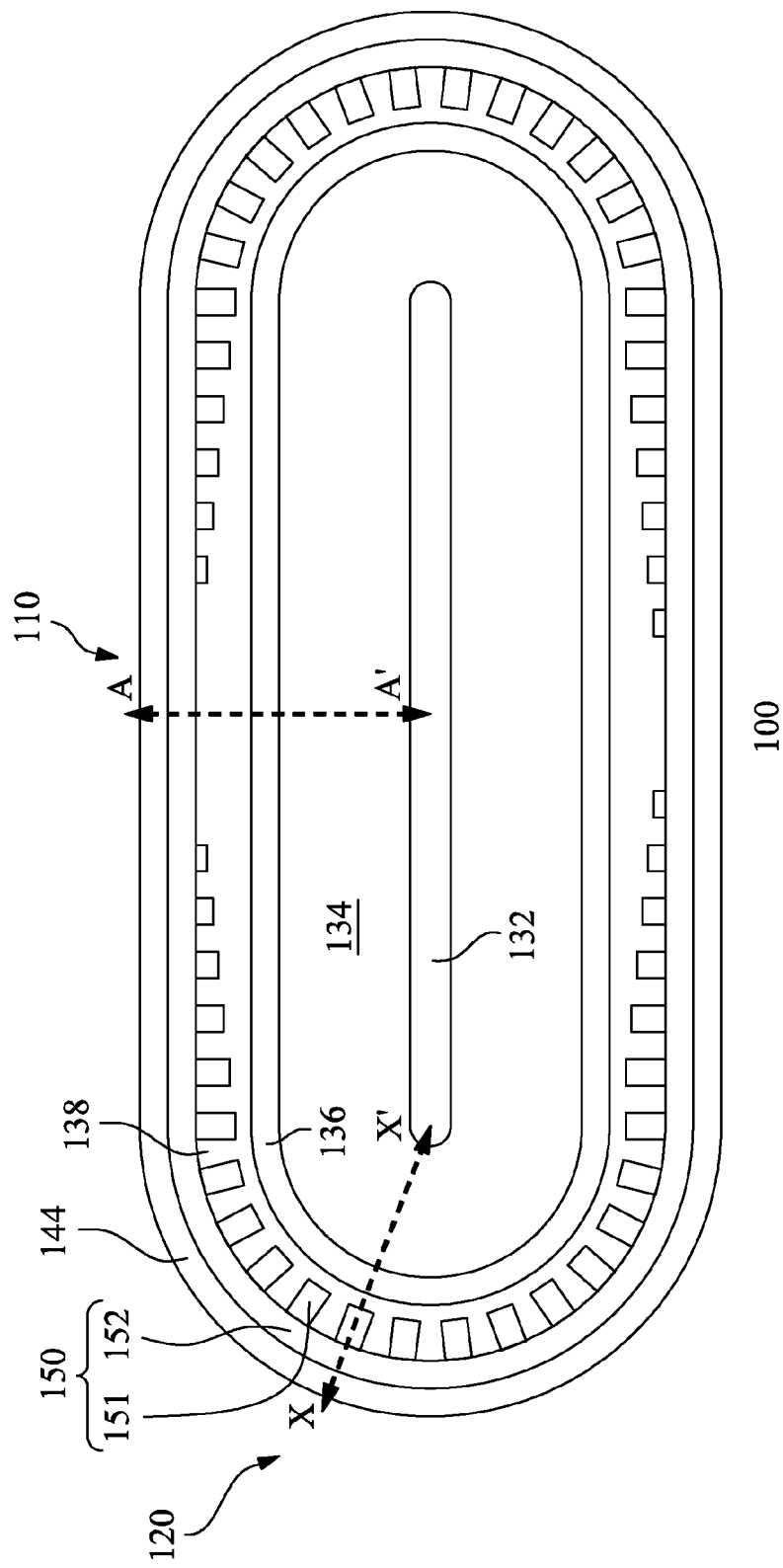
FIG. 1 is a top view of an exemplary UHV device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed earlier, UHV devices often suffer from low ESD capability due to non-uniform E-field distribution and local current crowding effect at a discontinuous region or a high curvature region of the devices. By modulation of a bulk or its extension, the local breakdown voltage in the high curvature region increases so that the ESD triggers and conducts current in the low curvature region, alleviating the low ESD capability.

The following depiction of the UHV devices takes NMOS as an example; the disclosure may be applied to PMOS by doping counter dopant or using counter doping material, for example, such as replacing an N+ diffusion layer with a P+ diffusion layer, replacing an N-well with a P-well. So the present disclosure is not limited to NMOS devices.

FIG. 1 is a top view of an exemplary UHV device in accordance with some embodiments. As shown in FIG. 1, a UHV device 100 is provided. The UHV device 100 has a first region 110 and a second region 120 having a greater curvature than the first region 110. The UHV device 100 includes a first N+ diffusion layer 132 as a drain, a field oxide 134, a gate structure 136, a second N+ diffusion layer 138 as a source, a P+ diffusion layer 150 as a bulk, and another field oxide 144.

The field oxide 134 surrounds the first N+ diffusion layer 132. The gate structure 136 is adjacent to the field oxide 134. The second N+ diffusion layer 138 is adjacent to the gate structure 136. The P+ diffusion layer 150 is in contact with the second N+ diffusion layer 138. The field oxide 144 surrounds the P+ diffusion layer 150. The P+ diffusion layer 150 includes a main portion 152 and a plurality of discrete extension portions 151 toward the first N+ diffusion layer 132. The area of each of the discrete extension portions 151 from the first region 110 to the second region 120 gradually increases. Additionally, the second N+ diffusion 138 has a smaller average area in the second region 120 than in the first region 110. The average area ratio of the P+ diffusion layer 150 to the second N+ diffusion layer 138 in the second region 120 is greater than that in the first region 110. In some embodiments, the P+ diffusion layer 150 in the first region 110 has the main portion 152 without the extension 151.

In some embodiments, the breakdown voltage of the UHV device 100 is about 100V to about 800V. The total width of the UHV device 100 is about 100 micrometers to about 4000 micrometers. The length of the UHV device 100 is about 0.1 micrometers to about 10 micrometers.

Figure 2:
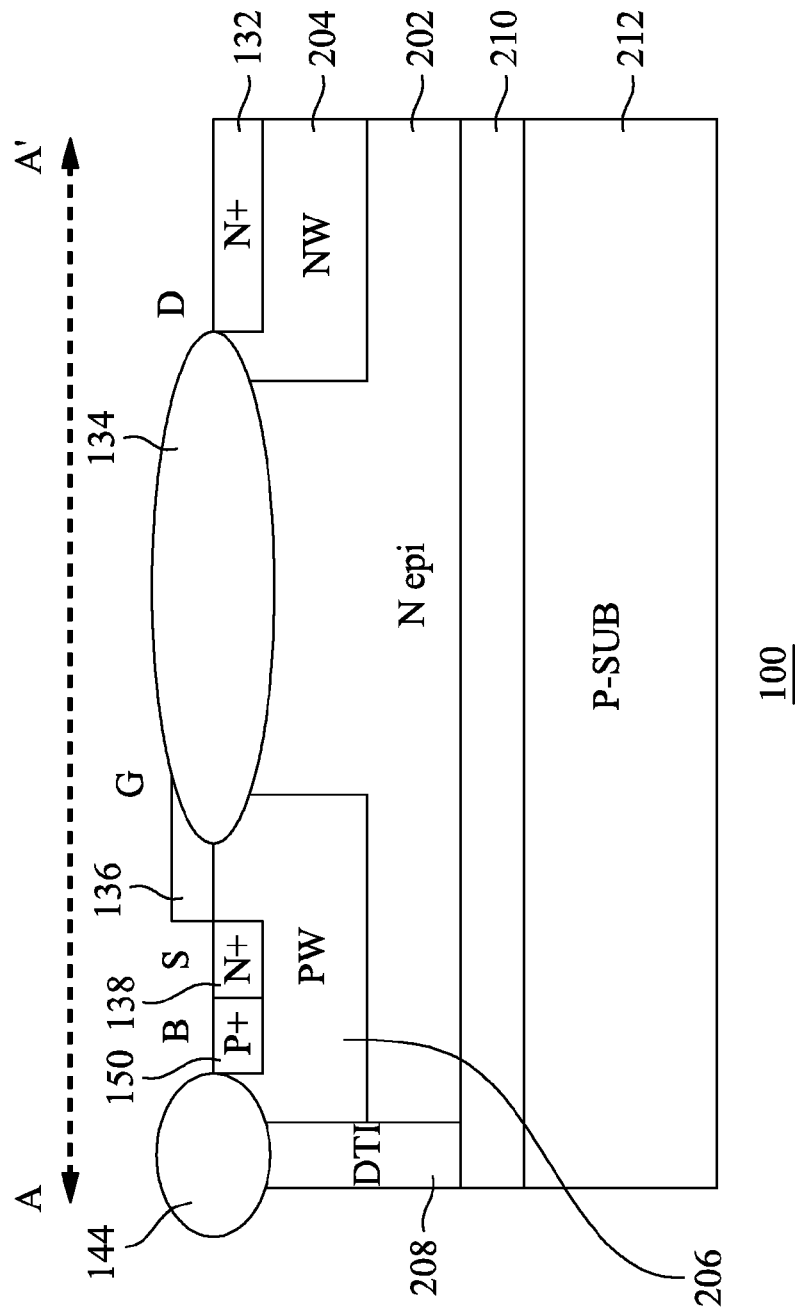
FIG. 2 is a cross sectional view of the first region 110 of the exemplary UHV device 100 along the line A-A' in FIG. 1 in accordance with some embodiments.

FIG. 2 is a cross sectional view of the first region 110 of the exemplary UHV device 100 along the line A-A' in FIG. 1 in accordance with some embodiments. As shown in FIG. 2, in addition to the first N+ diffusion layer 132, the field oxide 134, the gate structure 136, the second N+ diffusion layer 138, the P+ diffusion layer 150, and the field oxide 144, the UHV device 100 includes an N-type epitaxy layer 202, an N-well 204, a P-well 206, and a deep trench isolation (DTI) 208. In some embodiments, the UHV device 100 further includes an insulator 210 and a P-type substrate 212.

The P-well 206 is in the N-type epitaxy layer 202. The N-well 204 is in the N-type epitaxy layer 202, and the first N+ diffusion layer 132 is in the N-well 204. The second N+ diffusion layer 138 and the P+ diffusion layer 150 are the in the P-well 206. The gate structure 136 includes a polysilicon layer (not shown) over a portion of the P-well 206 and a gate oxide (not shown) between the polysilicon layer (not shown) and the P-well 206. The P-type substrate 212 is below the N-type epitaxy layer 202. The insulator 210 is between the N-type epitaxy layer 202 and the P-type substrate 212.

In the embodiment, the width of the P+ diffusion layer 150 is about 0.1 micrometers to about 10 micrometers, while the width of the second N+ diffusion layer 138 is about equal to that of the P+ diffusion layer 150, so that the width ratio of the P+ diffusion layer 150 to the second N+ diffusion layer 138 is about 1.

Figure 3:
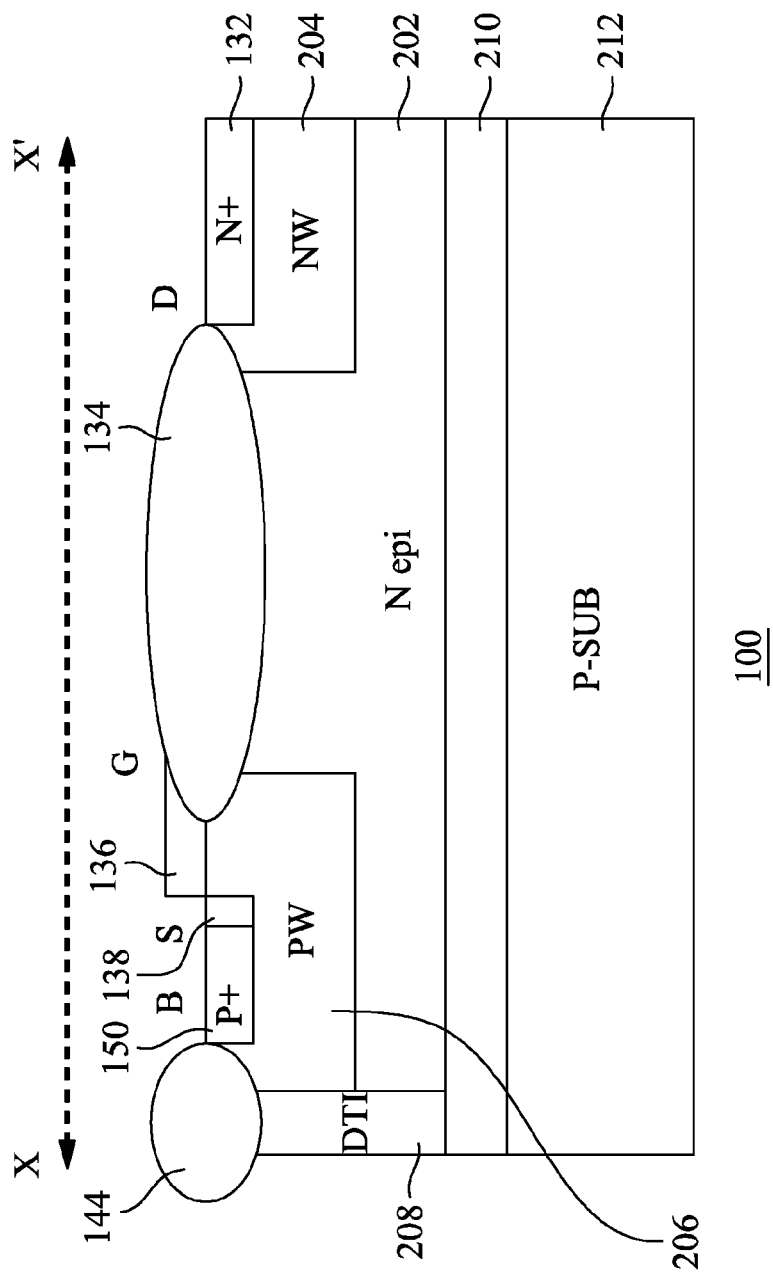
FIG. 3 is a cross sectional view of the second region 120 of the exemplary UHV device 100 along the line X-X' in FIG. 1 in accordance with some embodiments.

FIG. 3 is a cross sectional view of the second region 120 of the exemplary UHV device 100 along the line X-X' in FIG. 1 in accordance with some embodiments. As shown in FIG. 3, the elements in FIG. 3 are similar to those in FIG. 2 and not repeated herein. The P+ diffusion layer 150 has a greater width in the second region (corresponding to FIG. 3) than in the first region (corresponding to FIG. 2). The second N+ diffusion 138 has a smaller width in the second region (corresponding to FIG. 3) than in the first region (corresponding to FIG. 2). The width ratio of the P+ diffusion layer 150 to the second N+ diffusion layer 138 in the second region (corresponding to FIG. 3) is greater than that in the first region (corresponding to FIG. 2).

In the embodiment, compared to the cross sectional view in FIG. 3, the width of the P+ diffusion layer 150 increases while the width of the second N+ diffusion layer 138 goes down, so that the width ratio between the P+ diffusion layer 150 and the second N+ diffusion layer 138 also increases. In some embodiments, the P+ diffusion layer 150 extends and replaces the second N+ diffusion layer 138, so the second N+ diffusion layer 138 no longer substantially exists.

Figures 4A, 4B, 4C:
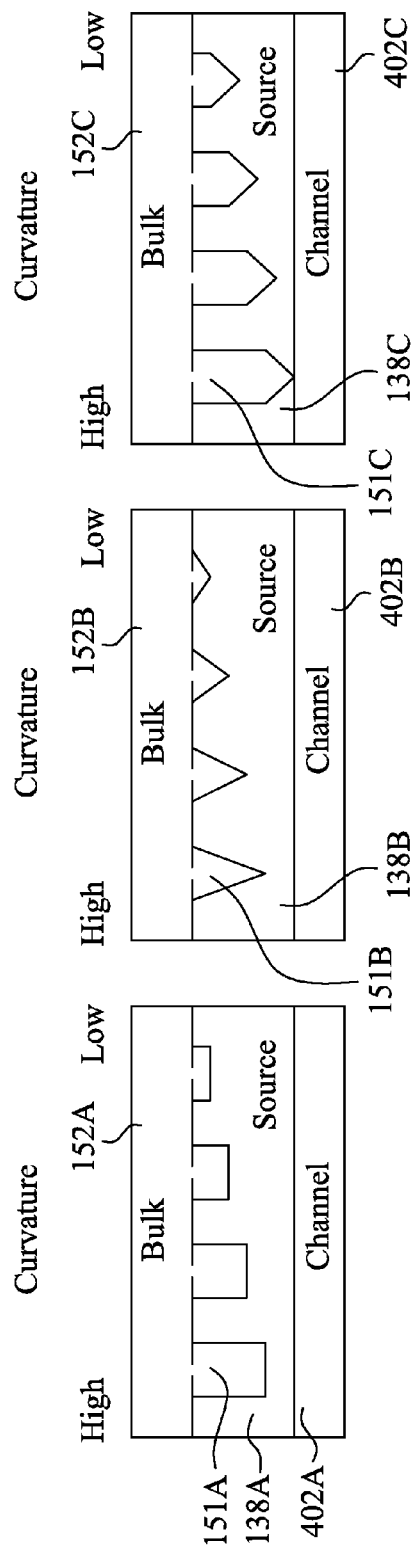
FIGS. 4A-4C are top views of a portion of the exemplary UHV device 100 in FIG. 1 in accordance with some embodiments.

By such modulation of the P+ diffusion layer 150 (bulk) or the extension 151 of the P+ diffusion layer 150 (bulk), the local breakdown voltage in the high curvature region increases. For example, the local breakdown voltage in the low curvature region is about 640V, and the local breakdown voltage without the modulation in the high curvature region is about 635V. By applying the modulation, the local breakdown voltage in the high curvature region may increase by about 5-10V and becomes about 640V-645V which is greater than that in the low curvature region, so that the ESD tends to trigger and conduct current in the low curvature region. Therefore, the modulation of the P+ diffusion layer 150 alleviates low ESD capability of the UHV device due to non-uniform E-field distribution and local current crowding effect at the discontinuous region or the high curvature region. In some embodiments, a gradual modulation of the P+ diffusion layer 150 (bulk) or the extension 151 of the P+ diffusion layer 150 (bulk) from high to low curvature may be applied to the UHV device 100. FIGS. 4A-4C are top views of a portion of the exemplary UHV device 100 in FIG. 1 in accordance with some embodiments. For example, as shown in FIG. 4A, the portion of the UHV device 100 includes a main portion 152A and a rectangular extension 151A of the P+ diffusion layer (not shown), a second N+ diffusion 138A in contact with the P+ diffusion layer 150, and a channel 402 under the gate structure (not shown). Different from FIG. 4A, the UHV device 100 in FIG. 4B has a triangle extension 151B, and the UHV device 100 in FIG. 4C has an inverse house-shape extension 151C. Such layout geometries, among others, of the extension 151A-151C and the second N+ diffusion 138A-138C can be implemented in UHV device 100.

In the embodiment, take FIG. 4C as an example, as the curvature becomes greater, the area of extension 151C increases while the area of the second N+ diffusion layer 138C goes down, so that the area ratio between the P+ diffusion layer 151C and the second N+ diffusion layer 138C also increases. In some embodiments, the P+ diffusion layer 151C overwhelms and replaces the second N+ diffusion layer 138C, so the second N+ diffusion layer 138C no longer substantially exists.

Figure 5:
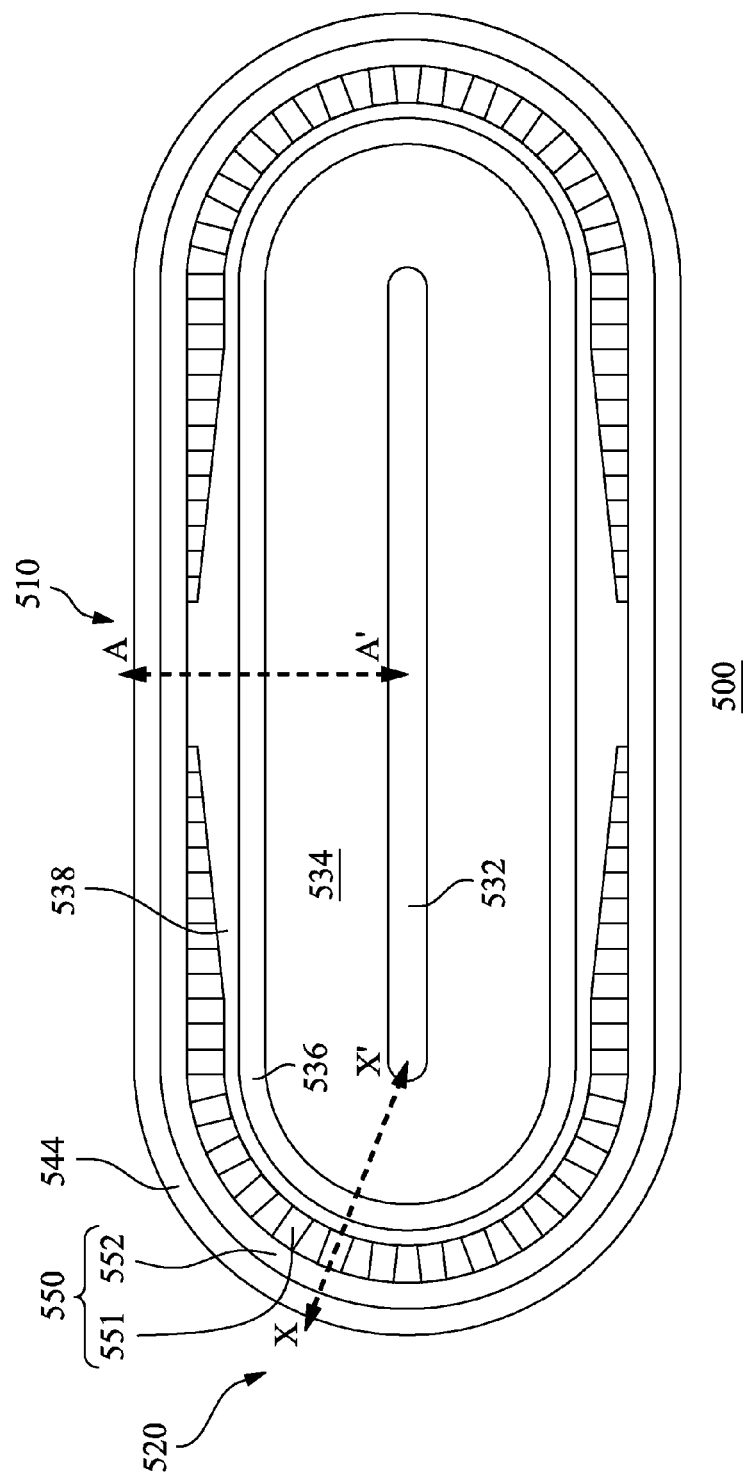
FIG. 5 is a top view of another exemplary UHV device in accordance with some embodiments.

FIG. 5 is a top view of another exemplary UHV device in accordance with some embodiments. As shown in FIG. 5, a UHV device 500 is provided. The UHV device 500 has a first region 510 and a second region 520 having a greater curvature than the first region 510. The UHV device 500 includes a first N+ diffusion layer 532 as a drain, a field oxide 534, a gate structure 536, a second N+ diffusion layer 538 as a source, a P+ diffusion layer 550 as a bulk, and another field oxide 544.

The field oxide 534 surrounds the first N+ diffusion layer 532. The gate structure 536 is adjacent to the field oxide 534. The second N+ diffusion layer 538 adjacent to the gate structure 536. The P+ diffusion layer 550 is in contact with the second N+ diffusion layer 538. The field oxide 544 surrounds the P+ diffusion layer 550. The P+ diffusion layer 550 includes a main portion 552 and a continuous extension 551. The continuous extension 551 from the first region 510 to the second region 520 gradually increases. Additionally, the second N+ diffusion 538 has a smaller area in the second region 520 than in the first region 510. The area ratio of the P+ diffusion layer 550 to the second N+ diffusion layer 538 in the second region 520 is greater than that in the first region 510.

The cross sectional views in the first region 510 and the second region 520 of the UHV device 500 are similar to FIGS. 2-3 and not repeated herein. By such modulation of the P+ diffusion layer 550 (bulk) or the extension 551 of the P+ diffusion layer 550 (bulk), the local breakdown voltage in the high curvature region increases so that the ESD triggers and conducts current in the low curvature region. It alleviates low ESD capability of the UHV device due to non-uniform E-field distribution and local current crowding effect at the discontinuous region or the high curvature region.

Figure 6:
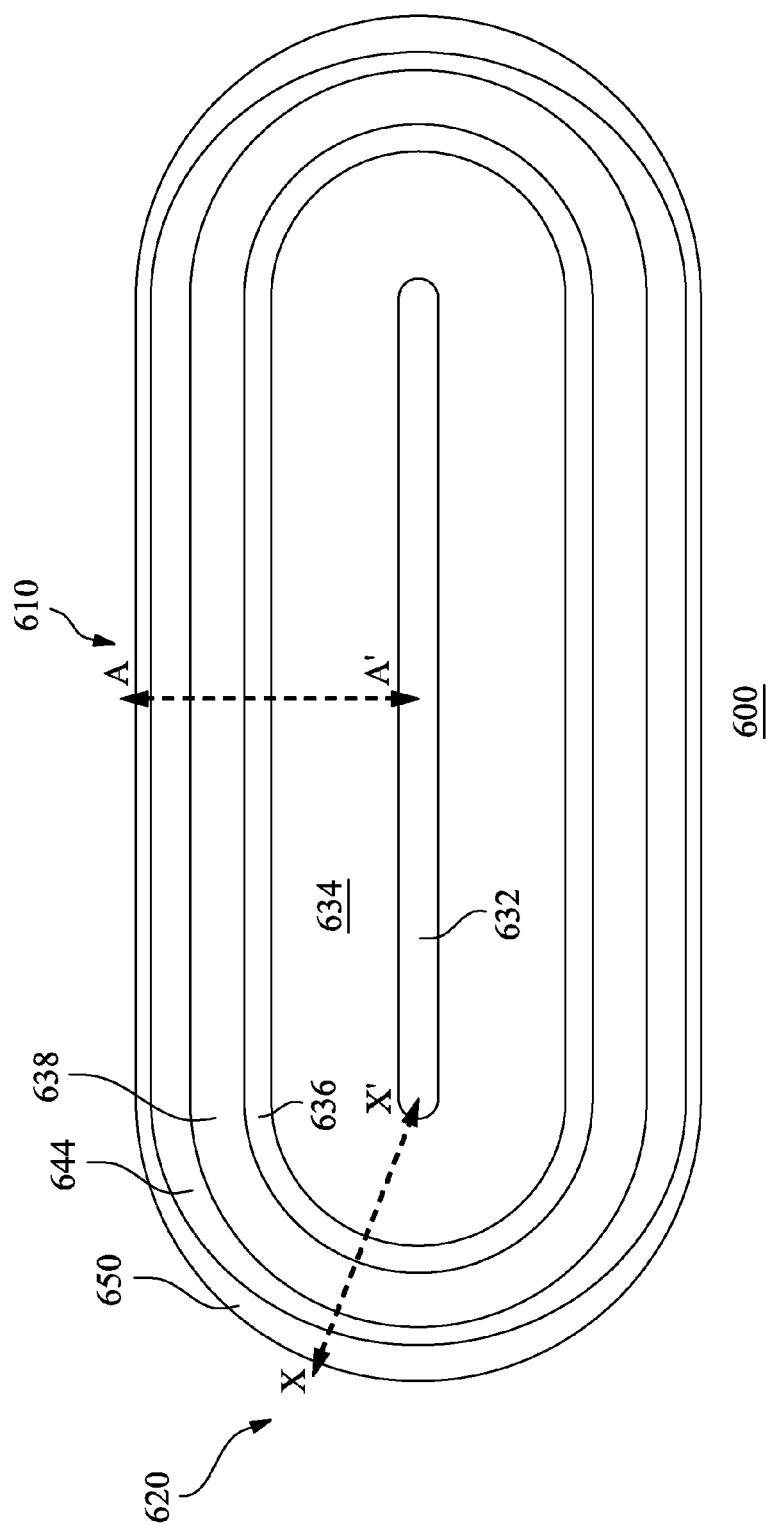
FIG. 6 is a top view of an exemplary UHV device in accordance with some embodiments.

FIG. 6 is a top view of an exemplary UHV device in accordance with some embodiments. As shown in FIG. 6, a UHV device 600 is provided. The UHV device 600 has a first region 610 and a second region 620 having a greater curvature than the first region 610. The UHV device 600 includes a first N+ diffusion layer 632 as a drain, a field oxide 634, a gate structure 636, a second N+ diffusion layer 638 as a source, a P+ diffusion layer 650 as a bulk, and an STI (shallow trench isolation) 644.

The field oxide 634 surrounds the first N+ diffusion layer 632. The gate structure 636 is adjacent to the field oxide 634. The second N+ diffusion layer 638 adjacent to the gate structure 636. The STI 644 separates the P+ diffusion layer 650 from the second N+ diffusion layer 638. The distance between the P+ diffusion layer 650 and the second N+ diffusion layer 638 is smaller in the second region than that in the first region. The STI 644 is smaller in the second region 620 than that in the first region 610. The STI 644 is continuous and gradually decreases from the first region 610 to the second region 620.

Figure 7:
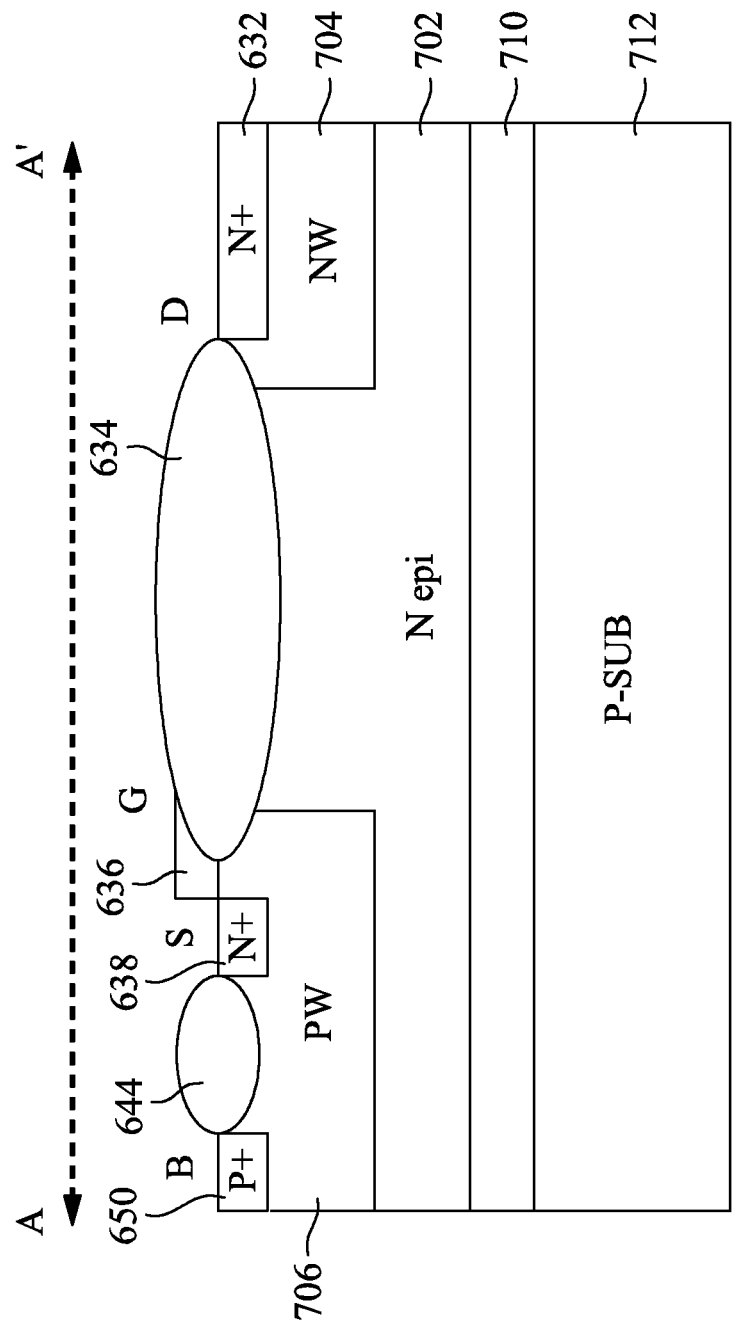
FIG. 7 is a cross sectional view of the first region 610 of the exemplary UHV device 600 along the line A-A' in FIG. 6 in accordance with some embodiments.

FIG. 7 is a cross sectional view of the first region 610 of the exemplary UHV device 600 along the line A-A' in FIG. 6 in accordance with some embodiments. As shown in FIG. 7, in addition to the first N+ diffusion layer 632, the field oxide 634, the gate structure 636, the second N+ diffusion layer 638, the P+ diffusion layer 650, and the STI 644, the UHV device 600 includes an N-type epitaxy layer 702, an N-well 704, and a P-well 706. In some embodiments, the UHV device 600 further includes an insulator 710 and a P-type substrate 712.

The P-well 706 is in the N-type epitaxy layer 702. The N-well 704 is in the N-type epitaxy layer 702, and the first N+ diffusion layer 632 is in the N-well 704. The second N+ diffusion layer 638 and the P+ diffusion layer 650 are the in the P-well 706. The gate structure 636 includes a polysilicon layer (not shown) over a portion of the P-well 706 and a gate oxide (not shown) between the polysilicon layer (not shown) and the P-well 706. The P-type substrate 712 is below the N-type epitaxy layer 702. The insulator 710 is between the N-type epitaxy layer 702 and the P-type substrate 712.

Figure 8:
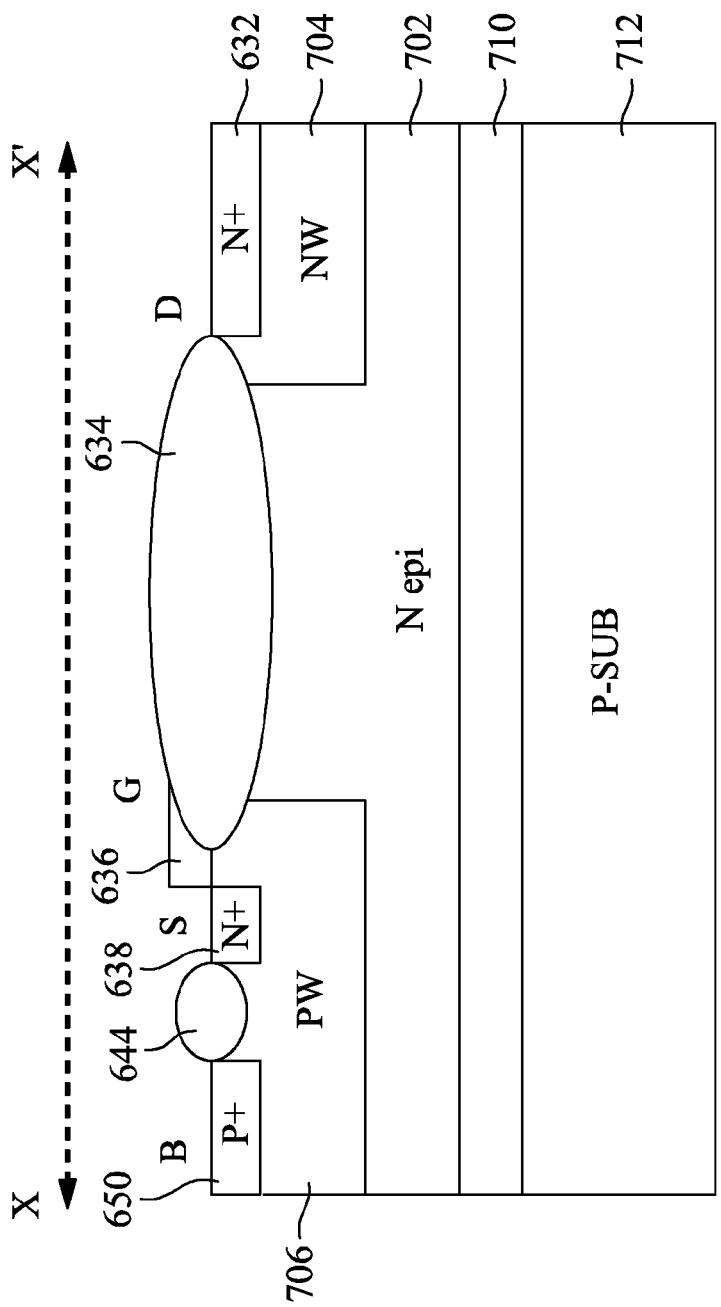
FIG. 8 is a cross sectional view of the second region 620 of the exemplary UHV device 600 along the line X-X' in FIG. 6 in accordance with some embodiments.

FIG. 8 is a cross sectional view of the second region 620 of the exemplary UHV device 600 along the line X-X' in FIG. 6 in accordance with some embodiments. As shown in FIG. 8, the elements in FIG. 8 are similar to those in FIG. 7 and not repeated herein. The STI 644 has a smaller width in the second region (corresponding to FIG. 8) than in the first region (corresponding to FIG. 7).

In some embodiments, the P+ diffusion layer 650 has a greater width in the second region (corresponding to FIG. 8) than in the first region (corresponding to FIG. 7). The width ratio of the P+ diffusion layer 650 to the second N+ diffusion layer 638 in the second region (corresponding to FIG. 8) is greater than that in the first region (corresponding to FIG. 7). In some embodiments, the area of the second N+ diffusion layer 638 remains the same both in FIGS. 7 and 8. In some embodiments, the area of the P+ diffusion layer 650 remains the same both in FIGS. 7 and 8. In some embodiments, the area of the STI 644 changes in FIGS. 7 and 8 while keeping the areas of the second N+ diffusion layer 638 and the P+ diffusion layer 650 the same.

By such modulation of the distance between the P+ diffusion layer 650 (bulk) and the second N+ diffusion 638 (source), the local breakdown voltage in the high curvature region increases so that the ESD triggers and conducts current in the low curvature region. It alleviates low ESD capability of the UHV device due to non-uniform E-field distribution and local current crowding effect at the discontinuous region or the high curvature region.

According to an embodiment, a semiconductor device having a first region and a second region is provided. The second region has a greater curvature than the first region. The device includes: an N-type epitaxy layer in the first region and the second region; an P-well in the N-type epitaxy layer; a first N+ diffusion layer in the N-type epitaxy layer; a second N+ diffusion layer in the P-well; and a P+ diffusion layer in the P-well and in contact with the second N+ diffusion layer, wherein the P+ diffusion layer has a greater area in the second region than in the first region.

According to an embodiment, a semiconductor device having a first region and a second region is provided. The second region has a greater curvature than the first region. The device includes: an N-type epitaxy layer in the first region and the second region; an P-well in the N-type epitaxy layer; a first N+ diffusion layer in the N-type epitaxy layer; a second N+ diffusion layer in the P-well; and a P+ diffusion layer in the P-well and separated from the second N+ diffusion layer, wherein a distance between the P+ diffusion layer and the second N+ diffusion layer is smaller in the second region than that in the first region.

According to an embodiment, a semiconductor device having a first region and a second region is provided. The second region has a greater curvature than the first region. The device includes: an N-type epitaxy layer in the first region and the second region; a P-well in the N-type epitaxy layer; a drain in the N-type epitaxy layer; a source in the P-well; and a bulk in the P-well and in contact with the source, wherein the bulk has a greater area in the second region than in the first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device having a first region and a second region, the second region having a greater curvature than the first region, the device comprising:
    an N-type epitaxy layer in the first region and the second region;
    a P-well in the N-type epitaxy layer;
    a first N+ diffusion layer in the N-type epitaxy layer;
    a second N+ diffusion layer in the P-well; and
    a P+ diffusion layer in the P-well and in contact with the second N+ diffusion layer, wherein the P+ diffusion layer has a greater area in the second region than in the first region, and (ii) comprises a greater extension in the second region than in the first region.

2. The device of claim 1, wherein the extension of the P+ diffusion layer has a plurality of discrete lateral extension portions toward the first N+ diffusion layer, wherein area of each of the discrete lateral extension portions from the first region to the second region gradually increases.

3. The device of claim 1, wherein the second N+ diffusion has a smaller area in the second region than in the first region.

4. The device of claim 1, wherein an area ratio of the P+ diffusion layer to the second N+ diffusion layer in the second region is greater than that in the first region.

5. The device of claim 1, further comprising an N-well in the N-type epitaxy layer, and wherein the first N+ diffusion layer is in the N-well.

6. The device of claim 1, further comprising: a polysilicon layer over a portion of the P-well; and a gate oxide between the polysilicon layer and the P-well.

7. The device of claim 4, wherein in the first region the area ratio of the P+ diffusion layer to the second N+ diffusion layer is about 1, and wherein in the second region the P+ diffusion layer replaces the second N+ diffusion layer, so the second N+ diffusion layer no longer substantially exists.

8. A semiconductor device having a first region and a second region, the second region having greater a curvature than the first region, the device comprising:
    an N-type epitaxy layer in the first region and the second region;
    a P-well in the N-type epitaxy layer;
    a drain in the N-type epitaxy layer;
    a source in the P-well; and
    a bulk in the P-well and in contact with the source, wherein the bulk (i) has a greater area in the second region than in the first region, and (ii) comprises a greater extension in the second region than in the first region.

9. The device of claim 8, wherein the extension of the bulk has a plurality of discrete lateral extension portions toward the first N+ diffusion layer, wherein area of each of the discrete extension portions from the first region to the second region gradually increases.

10. A semiconductor device having a first region and a second region, the second region having a greater curvature than the first region, the device comprising:
   an N-type epitaxy layer in the first region and the second region;
   a P-well in the N-type epitaxy layer;
   an N-type diffusion layer in the N-type epitaxy layer;
   a second N-type diffusion layer in the P-well; and
   a P-type diffusion layer in the P-well and in contact with the second N-type diffusion layer, wherein the P-type diffusion layer (i) has a greater area in the second region than in the first region, and (ii) comprises a greater extension in the second region than in the first region.

11. The semiconductor device of claim 10, wherein the extension of the P-type diffusion layer has a plurality of discrete lateral extension portions toward the first N-type diffusion layer, wherein area of each of the discrete lateral extension portions from the first region to the second region gradually increases.

12. The semiconductor device of claim 11, wherein each of the discrete lateral extension portions comprises a rectangular shape or a triangular shape.

13. The semiconductor device of claim 10, wherein the second N-type diffusion layer has a smaller area in the second region than in the first region.

14. The semiconductor device of claim 10, wherein an area ratio of the P-type diffusion layer to the second N-type diffusion layer in the second region is greater than that in the first region.

15. The semiconductor device of claim 14, wherein in the first region the area ratio of the P-type diffusion layer to the second N-type diffusion layer is about 1, and wherein in the second region the P-type diffusion layer replaces the second N-type diffusion layer, so the second N-type diffusion layer no longer substantially exists.

16. The semiconductor device of claim 10, further comprising:
   an N-well in the N-type epitaxy layer, the first N-type diffusion layer being disposed in the N-well.

17. The semiconductor device of claim 10, further comprising:
   a polysilicon layer over a portion of the P-well; and
   a gate oxide between the polysilicon layer and the P-well.

18. The device of claim 1, wherein the extension of the P+ diffusion layer is continuous and gradually increases from the first region to the second region.

19. The device of claim 8, wherein the extension of the bulk from the first region to the second region is continuous and gradually increases.

* * * * *